(12) United States Patent
Huang et al.

(10) Patent No.: US 11,287,471 B1
(45) Date of Patent: Mar. 29, 2022

(54) ELECTRONIC CIRCUIT FOR ONLINE MONITORING A CLOCK SIGNAL

(71) Applicant: National Tsing Hua University, Hsinchu (TW)

(72) Inventors: Shi-Yu Huang, Hsinchu (TW); Wei-Hao Chen, Hsinchu (TW); Chu-Chun Hsu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 17/037,752

(22) Filed: Sep. 30, 2020

(51) Int. Cl.
  *G01R 31/317* (2006.01)
  *H03L 7/08* (2006.01)
  *H03K 3/037* (2006.01)

(52) U.S. Cl.
  CPC ....... *G01R 31/31709* (2013.01); *H03K 3/037* (2013.01); *H03L 7/08* (2013.01)

(58) Field of Classification Search
  CPC .............. G01R 31/31709; G01R 31/31725
  See application file for complete search history.

(56) References Cited

U.S. PATENT DOCUMENTS

| | | | |
|---|---|---|---|
| 2006/0132340 A1* | 6/2006 | Lin | G04F 10/005 341/120 |
| 2008/0240328 A1* | 10/2008 | Fukushima | G01R 31/2824 375/376 |
| 2018/0011142 A1* | 1/2018 | Choo | G01R 31/31709 |

* cited by examiner

*Primary Examiner* — Patrick O Neill
(74) *Attorney, Agent, or Firm* — JCIPRNET

(57) ABSTRACT

An electronic circuit for online monitoring a clock signal is provided. The electronic circuit includes a period-to-pulse converter, a pulse-shrinking block and an encoder. The period-to-pulse converter receives the clock signal outputted by a phase-locked loop, and converts each of a plurality of clock period samples of the clock signal to generate a pulse-train signal having a plurality of pulses. The pulse-shrinking block receives the plurality of pulses of the pulse-train signal, and generates a plurality of catch bits by shrinking the plurality of pulses of the pulse-train signal. The encoder outputs a minimum code denoting a minimum clock period of the clock signal and a maximum code denoting a maximum clock period of the clock signal according to the plurality of catch bits. The electronic circuit subtracts the maximum code and the minimum code to generate a peak-to-peak jitter amount code.

10 Claims, 4 Drawing Sheets

ELECTRONIC CIRCUIT FOR ONLINE MONITORING A CLOCK SIGNAL

BACKGROUND

Technical Field

The disclosure relates to a circuit design, and particularly relates to an electronic circuit for online monitoring a clock signal provided by a phase-locked loop.

Description of Related Art

For safety-critical automotive or biomedical devices, online health monitoring has become increasingly more and more important. These monitors can help expose the potential weaknesses of a device during the silicon validation process, and also quickly pin-point the root cause of a failed device returned by the customers, and thereby one can effectively shorten the turn-around time for product debugging and revision. Moreover, these monitors may further help capture the performance hazard due to various causes (such as worsening parametric defects, environmental noises, soft errors, and/or ageing), and thereby alerting the system to react in advance to avoid potential fatal failures.

In this regard, one of the usual methods is that the monitor can check for peak-to-peak jitter of the clock signal generated by a phase-locked loop (PLL) applied in the device, and the phase error between the input and the output signals of a delay locked loop (DLL). For the phase-locked loop, the clock period variation is one important health condition indicator. Therefore, how to effectively monitor the clock signal generated by the phase-locked loop is an important research direction in this field, and solutions of several embodiments are provided below.

SUMMARY

The disclosure is directed to an electronic circuit for monitoring a clock signal, and is capable of performing effective online monitoring of the clock signal provided by a phase-locked loop.

The electronic circuit of the disclosure includes a period-to-pulse converter, a pulse-shrinking block and an encoder. The period-to-pulse converter receives the clock signal outputted by a phase-locked loop, and converts each of a plurality of clock period samples of the clock signal to generate a pulse-train signal having a plurality of pulses. The pulse-shrinking block receives the plurality of pulses of the pulse-train signal, and generates a plurality of catch bits by shrinking the plurality of pulses of the pulse-train signal. The encoder outputs a minimum code denoting a minimum clock period of the clock signal and a maximum code denoting a maximum clock period of the clock signal according to the plurality of catch bits. The electronic circuit subtracts the maximum code and the minimum code to generate a peak-to-peak jitter amount code.

Based on the above, according to the electronic circuit of the disclosure, the electronic circuit can obtain the minimum code and the maximum code corresponding to the clock signal by monitoring the shrinking result of the plurality of pulses of the pulse-train signal converted by the clock signal, and can calculate the peak-to-peak jitter amount code related to the clock signal by subtracting the minimum code and the maximum code.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
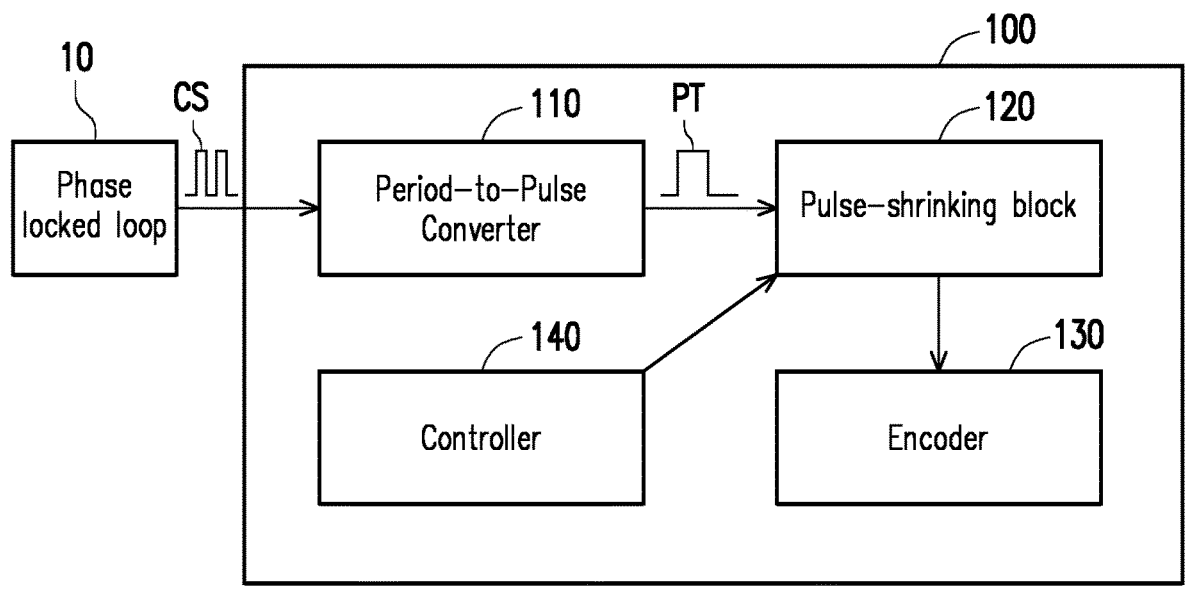
FIG. 1 is a schematic diagram illustrating an electronic circuit according to an embodiment of the disclosure.

FIG. 1 is a schematic diagram illustrating an electronic circuit according to an embodiment of the disclosure. Referring to FIG. 1, the electronic circuit 100 is coupled to a phase-locked loop 10, and configured to receive a clock signal CS generated by the phase-locked loop 10. The phase-locked loop 10 may be applied in, for example, a safety-critical automotive or a biomedical device. In the embodiment of the disclosure, the electronic circuit 100 can uninterruptedly process a clock signal CS continuously generated by the phase-locked loop 10 to online monitor the clock signal CS, and output digital data denoting a plurality of clock period changes of the clock signal CS, such as a minimum clock period, a maximum clock signal and a peak-to-peak jitter amount code related to the clock signal CS. Thus, the electronic circuit 100 or other processing circuit of the device can, for example, effective determine whether the operational status of the device is normal based on analysis of the minimum clock period, the maximum clock signal and the peak-to-peak jitter amount code. However, the disclosure does not limited that the clock signal CS is generated by the phase-locked loop 10. In other embodiments of the disclosure, the clock signal CS may be captured from other clock systems or other function circuits, and the electronic circuit 100 is capable of immediately determining the circuit operation status or the clock system operation status by online monitoring the clock signal CS.

It is should be explained that, during a normal operation, the output frequency of the phase-locked loop 10 in a locked state is usually very accurate in the average sense, where the output frequency may be 1 GHz. As a result, its output clock period samples tends to have a distribution with the nominal value equal to the target clock period. Furthermore, the distribution tends to have a relatively symmetric deviation from its nominal value, e.g., [−10 ps, +10 ps]. However, when the phase-locked loop 10 is impacted by an online fault or transient noise, this symmetric property could be disrupted momentarily, leading to an abnormal condition, in which the minimum clock period could be excessively small (e.g., changing from 43 to 36) while maximum clock period may stay normal (e.g., at 50), or vice versa. Under this faulty situation, the peak-to-peak jitter amount indicator may still flag an abnormal condition (e.g., from 50−43=7 to 50−36=14). However, there is little knowing whether its increase from 7 to 14 is due to either a too-small minimum clock period or a too-large maximum clock period. On the other hand, the disclosure circuit reveals not only maximum clock period but also minimum clock period of an anomaly.

Therefore, the electronic circuit 100 of the embodiment is configured to focus on the monitoring of the phase-locked loop 10 used for digital clocking. In particular, an abnormally small minimum clock period is especially detrimental (than a too-large maximum clock period) since it could spark computational failure in the logic circuits driven by the phase-locked loop 10 output clock signal. Thus, the electronic circuit 100 is designed to capable of timely reporting any change of the minimum clock period and the maximum clock period during a monitoring session. Moreover, from these two quantities, the peak-to-peak jitter amount may be derived as a supplementary health condition indicator too.

Specifically, the electronic circuit 100 of the embodiment includes a period-to-pulse converter 110, a pulse-shrinking block 120, an encoder 130 and a controller 140. The electronic circuit 100 may be a time-to-digital converter (TDC), but the disclosure is not limited thereto. In the embodiment of the disclosure, the period-to-pulse converter 110 is coupled to the phase-locked loop 10, and receives the clock signal CS from the phase-locked loop 10. The pulse-shrinking block 120 is coupled to the period-to-pulse converter 110, the encoder 130 and the controller 140. The controller 140 may output a control signal or an enable signal to the pulse-shrinking block 120 to control or enable the pulse-shrinking block 120. In the embodiment of the disclosure, the period-to-pulse converter 110 may convert each of a plurality of clock period samples of the clock signal CS to generate a pulse-train signal PT having a plurality of pulses to the pulse-shrinking block 120. In the embodiment of the disclosure, the period-to-pulse converter 110 may convert each raising edge or each falling edge of a plurality of signal waveforms of the clock signal CS to the plurality of pulses of the pulse-train signal PT. Thus, each pulse width of the plurality of pulses of the pulse-train signal PT is positively related to each clock period length of the plurality of clock period samples of the clock signal CS.

In the embodiment of the disclosure, the pulse-shrinking block 120 may generate a plurality of catch bits by shrinking the plurality of pulses of the pulse-train signal PT. The encoder 130 may generate a minimum code denoting a minimum clock period of the clock signal CS and a maximum code denoting a maximum clock period of the clock signal CS according to the plurality of catch bits, and outputs the minimum code and the maximum code to other processing circuit of the electronic circuit 100. For example, the encoder 130 may be a watermark-to-binary encode, and the number of the plurality of catch bits may be 64. The encoder 130 generate a binary code having 5 bits by converting the 64 catch bits. Furthermore, the electronic circuit 100 may subtract the minimum code and the maximum code, so as to generate a peak-to-peak jitter amount code (PPJA code) denoting a peak-to-peak period jitter of the clock signal CS. In addition, the electronic circuit 100 of the embodiment may be an all-digital electronic circuit and the phase-locked loop 10 may be an all-digital phase-locked loop (ADPLL), but the disclosure is not limited thereto.

Figure 2:
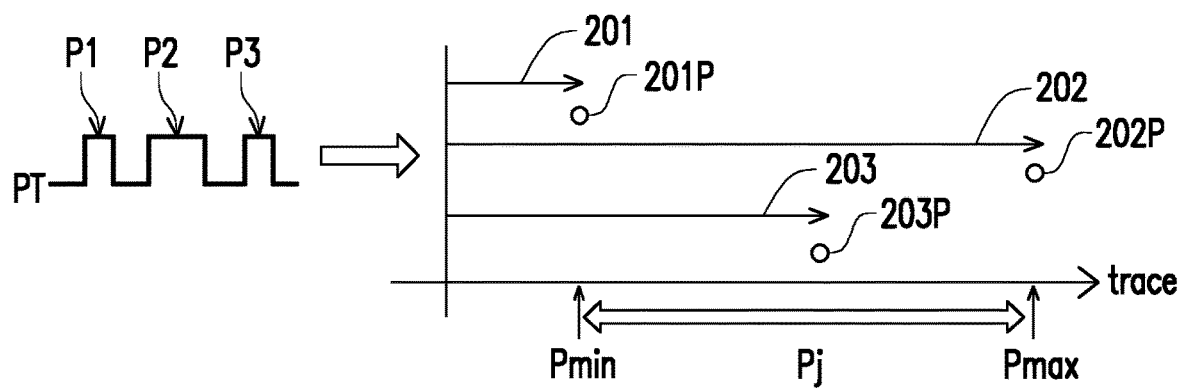
FIG. 2 is a trace diagram illustrating the concept of survival traces and watermarks corresponding to the plurality of clock period samples according to an embodiment of the disclosure.

FIG. 2 is a trace diagram illustrating a watermark rule according to an embodiment of the disclosure. Referring to FIG. 1 and FIG. 2, the following description first conceptually explains how to determine the minimum clock period and the maximum clock period of the clock signal CS based on the watermark rule. In the embodiment of the disclosure, the electronic circuit 100 may turn the survival trace of each pulse of the pulse-train signal PT entering the pulse-shrinking block 120 into a "one-dot watermark" or simply watermark for short. As shown in FIG. 2, there are three input pulses P1~P3 of the pulse-train signal PT entering the pulse-shrinking block 120 in sequence, and taking on three respective pulse shrinking journeys and leaving three survival traces 201~203. The three input pulses P1~P3 of the pulse-train signal PT are corresponding to three clock period samples of the clock signal CS.

In the embodiment of the disclosure, after the three survival traces 201~203 have been processed by the pulse-shrinking block 120, the electronic circuit 100 may record three watermark locations 201P~203P. The electronic circuit 100 may further combine the three watermark locations 201P~203P to report the minimum clock period Pmin, maximum clock period Pmax, and the peak-to-peak jitter amount code Pj of the clock signal CS quickly at any time during the monitoring session. Based on the above, the specific circuit implementation of the pulse-shrinking block 120 will be described in detail in the following embodiments.

Figure 3:
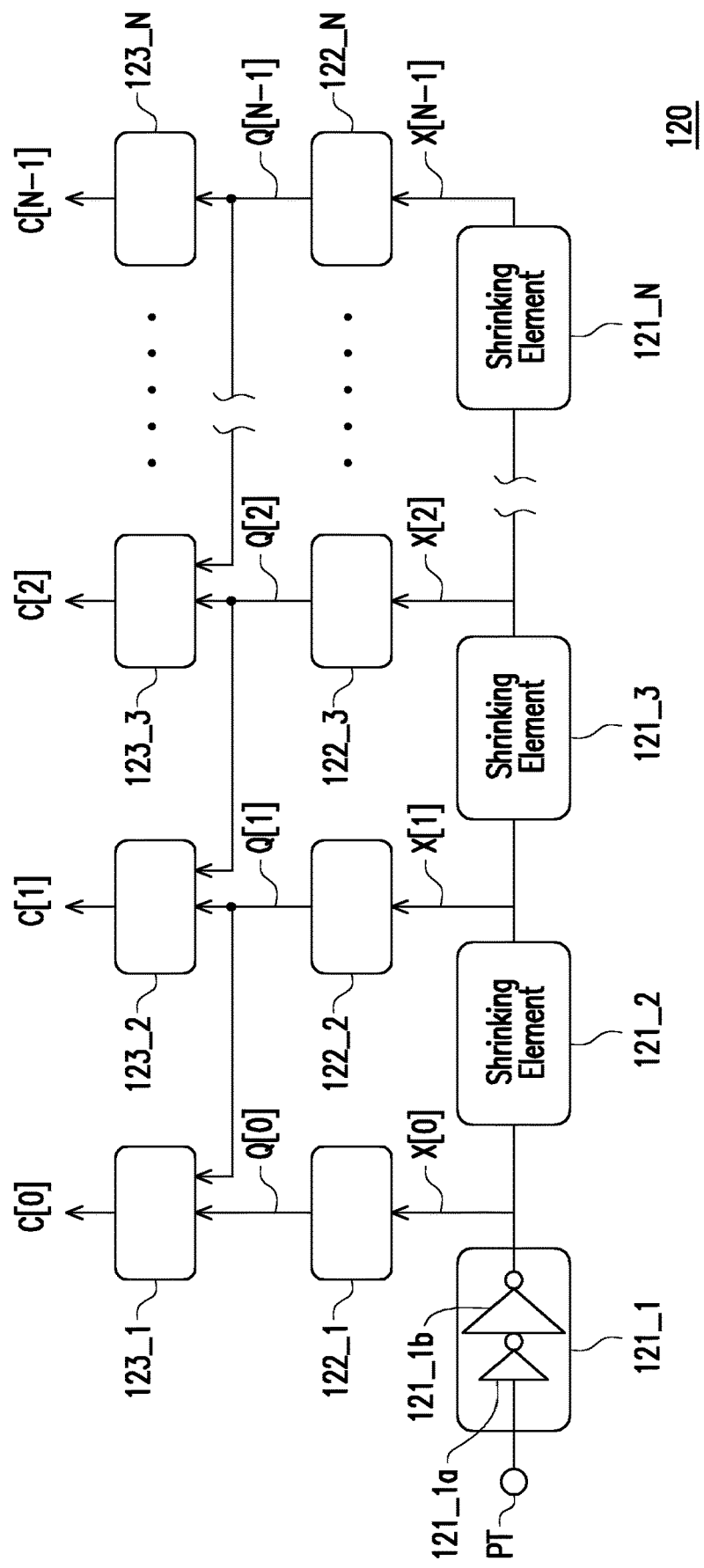
FIG. 3 is a schematic diagram illustrating a pulse-shrinking block according to an embodiment of the disclosure.

FIG. 3 is a schematic diagram illustrating a pulse-shrinking block according to an embodiment of the disclosure. Referring to FIG. 3, in the embodiment of the disclosure, the pulse-shrinking block 120 includes a plurality of shrinking elements 121_1~121_N, a plurality of first layer circuits 122_1~122_N and a plurality of second layer circuits 123_1~123_N, where N is a positive integer. The plurality of first layer circuits 122_1~122_N and the plurality of second layer circuits 123_1~123_N are a flip-flop (FF) circuit respectively. The shrinking element 121_1 is composed of two inverters 121_1a and 121_1b coupled in series, and the internal elements of the shrinking elements 121_2 to 121_N are the same as the shrinking element 121_1. More specifically, the above circuits and elements of the pulse-shrinking block 120 can be classified as a plurality of stages, and each of the plurality of stages includes one shrinking element, one first layer circuit and one second layer circuit.

In the embodiment of the disclosure, the input terminal of first shrinking element 121_1 is configured to receive the pulse-train signal PT, and the output terminal of first shrinking element 121_1 is coupled to the first layer circuit 122_1 and shrinking element 121_2 of next stage. The first layer circuit 122_1 is coupled to the second layer circuit 123_1. For one pulse of the pulse-train signal PT, the first shrinking element 121_1 shrinks the one pulse of the pulse-train signal PT to output a current shrinking pulse X[0] to the first layer circuit 122_1 and shrinking element 121_2 of next stage. In the embodiment of the disclosure, the first layer circuit 122_1 outputs a current uni-stable signal Q[0] with a current stable value according to the current shrinking pulse X[0] to the second layer circuit 123_1. The second layer circuit 123_1 receives the current uni-stable signal Q[0] with the current stable value and next uni-stable signal Q[1] with a next stable value from first layer circuit 122_1 of next stage. In the embodiment of the disclosure, the second layer circuit 123_1 compares the current stable value and the next stable value to determine catch bit C[0]. Thus, for multiple pulses of the pulse-train signal 102, the second layer circuit 123_1 sequentially compares the plurality of current stable values and the plurality of next stable values to decide whether the catch bit C[0] is set to "1".

Then, the input terminals of first shrinking element 121_2 is configured to receive the previous shrinking pulse from the previous stage (first shrinking element 121_1), and the output terminals of first shrinking element 121_2 is coupled to the first layer circuit 122_2 and shrinking element 121_3 of next stage. The first layer circuit 122_2 is coupled to the second layer circuit 123_2. The first shrinking element 121_2 shrinks the previous shrinking pulse X[0] to output a current shrinking pulse X[1] to the first layer circuit 122_2 and shrinking element 121_3 of next stage. In the embodiment of the disclosure, the first layer circuit 122_2 outputs a current uni-stable signal Q[1] with a current stable value according to the current shrinking pulse X[1] to the second layer circuit 123_2. The second layer circuit 123_2 receives the current uni-stable signal Q[1] with the current stable value and next uni-stable signal Q[2] with a next stable value from first layer circuit 122_3 of next stage. In the embodiment of the disclosure, the second layer circuit 123_2 compares the current stable value and the next stable value to determine catch bit C[1]. Therefore, by analogy, the second layer circuit 123_1~123_N sequentially compares the plurality of current stable values and the plurality of next stable values to determine the plurality of catch bits C[0]~C[N−1].

Based on the architecture of pulse-shrinking block 120 as shown in FIG. 3, referring to FIG. 1, the period-to-pulse converter 110 may uninterruptedly receives a plurality of clock signals to output a plurality of pulse-train signals to the pulse-shrinking block 120, and the pulse-shrinking block 120 generates a plurality catch bit sequences. Then, the encoder 130 outputs a plurality of minimum codes and a plurality of maximum codes corresponding to the plurality catch bit sequences during a plurality of monitoring periods, so that the electronic circuit 100 can real-time determine a plurality of peak-to-peak jitter amount codes corresponding to the plurality of clock signals.

Figure 4:
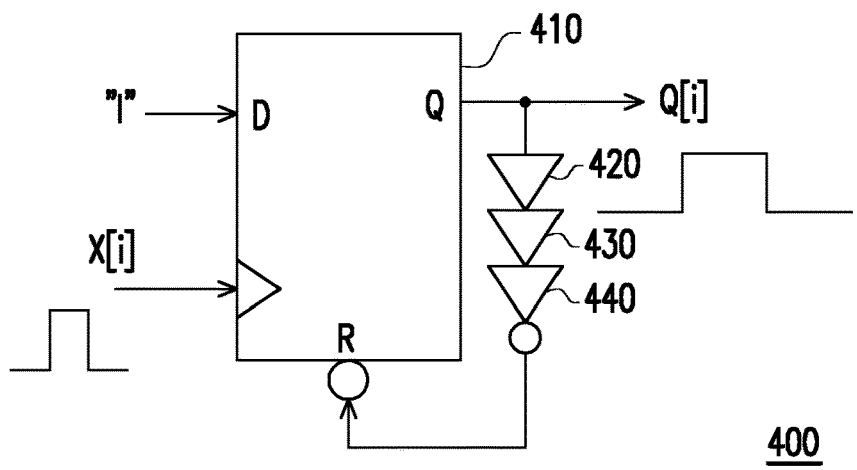
FIG. 4 is a schematic diagram illustrating a first layer circuit of the disclosure.

FIG. 4 is a schematic diagram illustrating a first layer circuit of the disclosure. Referring to FIG. 4, each of the first layer circuits 122_1~122_N of FIG. 3 may similar to the first layer circuit 400. The first layer circuit 400 includes a first flip-flop unit 410, two buffers 420 and 430 and an inverter 440, but the disclosure is not limited thereto. In other embodiments of the disclosure the number of the buffer may be determined according to different process conditions or different circuit design requirements. In the embodiment of the disclosure, when an input terminal (Data input pin) (D) of the first flip-flop unit 410 receives a signal with a high logic level ("1"), a trigger terminal of the first flip-flop unit 410 is coupled to the shrinking element of the same stage, an output terminal (Data output pin) (Q) of the first flip-flop unit 410 is coupled to the second layer circuit of the same stage, and the output terminal of the first flip-flop unit 410 is coupled to an inverted reset terminal (asynchronous reset pin) of the first flip-flop unit 410 through the two buffers 420 and 430 and the inverter 440 coupled in series.

In the embodiment of the disclosure, the trigger terminal of the first flip-flop unit 440 receives a shrinking pulse X[i] from the shrinking element of the same stage, where i is between the positive integer and N. Thus, the output terminal of the first flip-flop unit 410 outputs an uni-stable signal Q[i] with a high logic level ("1") of a stable value when the trigger terminal of the first flip-flop unit 410 receives the shrinking pulse X[i]. And then, when the inverted reset terminal of the first flip-flop unit 410 receive the inverted and delayed uni-stable signal Q[i] by the feedback path (the two buffers 420 and 430 and the inverter 440), the uni-stable signal Q[i] is reset to a low logic level ("0"), thus the uni-stable signal has one-shot pulse-width.

Figure 5A:
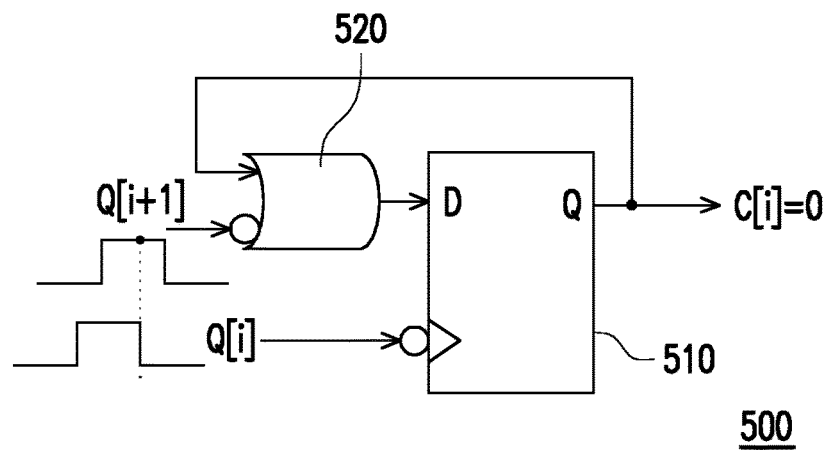
FIG. 5A is a schematic diagram illustrating a second layer circuit operating at a first case of the disclosure.
Figure 5B:
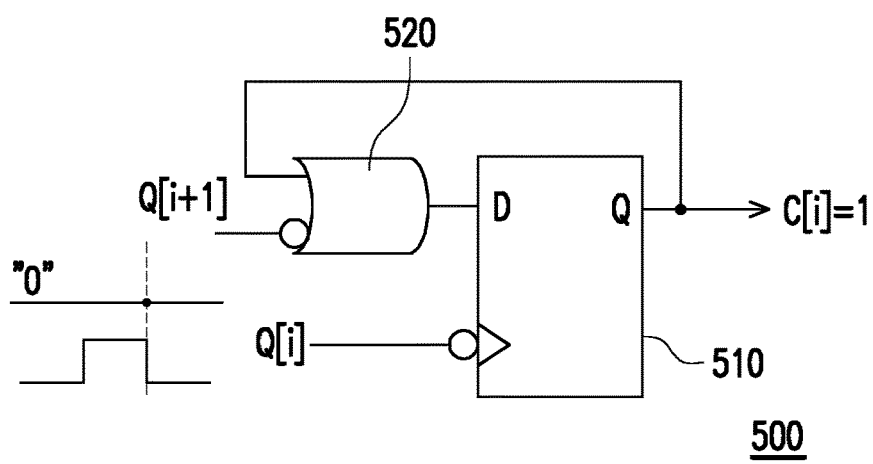
FIG. 5B is a schematic diagram illustrating a second layer circuit operating at a second case of the disclosure.

FIG. 5A is a schematic diagram illustrating a second layer circuit operating at a first case of the disclosure. FIG. 5B is a schematic diagram illustrating a second layer circuit operating at a second case of the disclosure. Referring to FIG. 5A and FIG. 5B, each of the second layer circuits 123_1~123_N of FIG. 3 may similar to the second layer circuit 500. The second layer circuit 500 includes a second flip-flop unit 510 and an OR gate 520. In the embodiment of the disclosure, an input terminal of the second flip-flop unit 510 is coupled to an output terminal of the OR gate 520, an inverted trigger terminal is coupled to the output terminal of the first flip-flop unit of the same stage, and an output terminal of the second flip-flop unit 510 is coupled to an input terminal of the OR gate, and an inverted input terminal of the OR gate is coupled to an output terminal of another first flip-flop unit of next stage.

In the embodiment of the disclosure, the trigger terminal of the second flip-flop unit 520 receives the uni-stable signal Q[i] from the first flip-flop unit of the same stage, and the inverted input terminal of the OR gate receives the uni-stable signal Q[i+1] from the next stage. Thus, the catch bit C[i] of the output terminal of the second flip-flop unit 510 will become the high logic level ("1") at falling edge of the uni-stable signal Q[i] only when either catch bit C[i] has been set to the high logic level ("1") previously, the uni-stable signal Q[i+1] is the low logic level ("0").

It is should be noted that, the second layer circuit 500 associated with a fine-shrinking element is depicted in FIG. 5A and FIG. 5B. Its behavior is to realize the aforementioned "watermark rule", while making its output, the catch bit C[i] sticky. At the beginning of a monitoring session, the catch bit C[i] is reset to "0". Then the second layer circuit 500 checks for the watermark rule repeatedly. Once the catch bit C[i] is set to "1", it stays at "1" throughout the entire monitoring session. In the circuit of the second layer circuit 500, the watermark rule and the sticky requirement are combined by the following condition: the catch bit C[i] will become "1" at the falling edge of the uni-stable signal Q[i] only when either catch bit C[i] has been set to "1" previously, or the uni-stable signal Q[i+1] is "0". The timing relationships of the waveforms of the uni-stable signal Q[i] and the uni-stable signal Q[i+1] are illustrated in FIG. 5A and FIG. 5B. The first case of FIG. 5A is not the watermark situation, because at falling edge of the uni-stable signal Q[i] and the uni-stable signal Q[i+1] is "1". The second case of FIG. 5B is the watermark situation, because at falling edge of the uni-stable signal Q[i] and the uni-stable signal Q[i+1] is "0".

Figure 6:
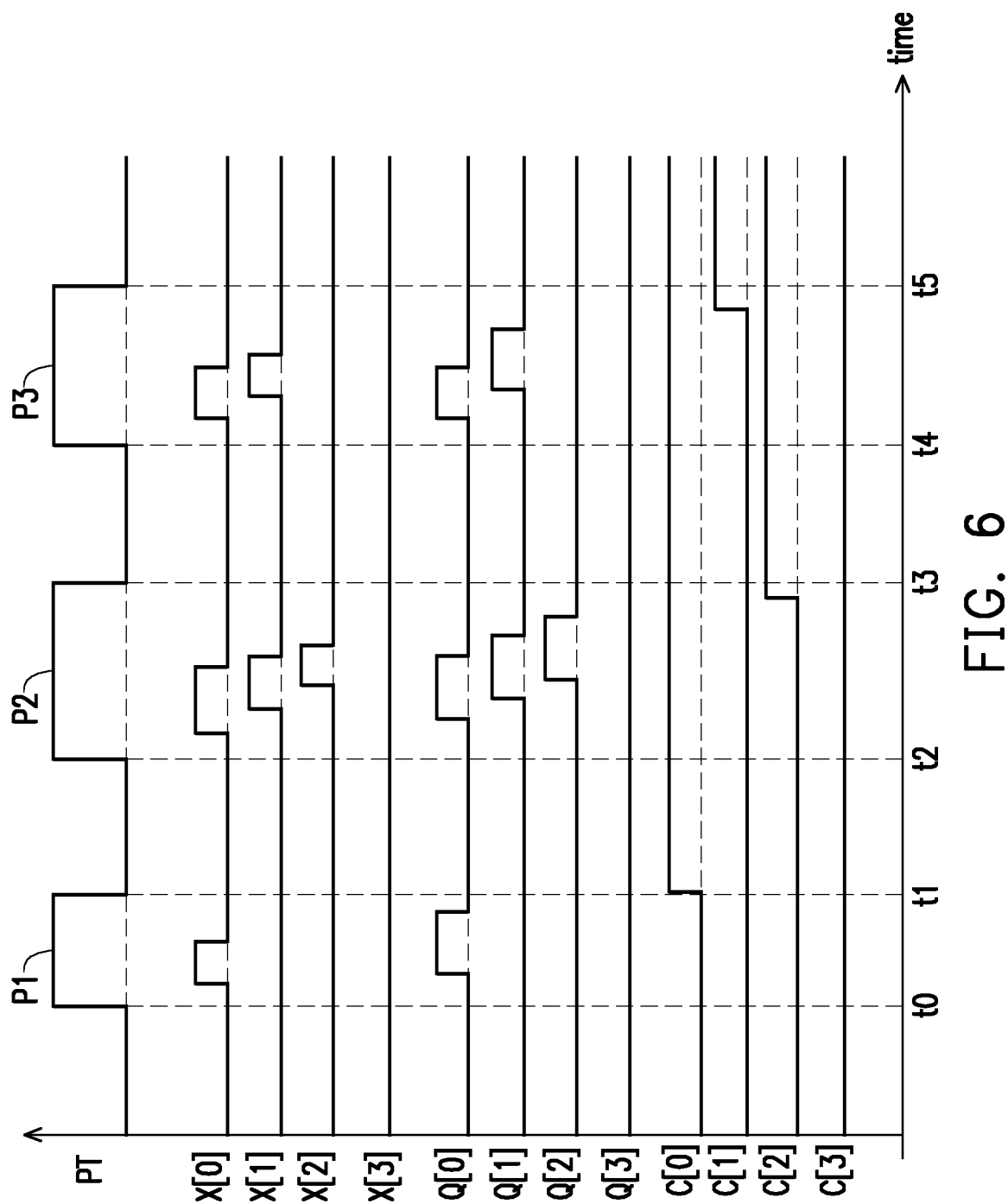
FIG. 6 is a waveform diagram illustrating the pulse-shrinking block shrinking a plurality of pulses of the disclosure.

FIG. 6 is a waveform diagram illustrating the pulse-shrinking block shrinking a plurality of pulses of the disclosure. Referring to FIG. 1, FIG. 3, and FIG. 6, the encoder 130 may convert the catch bits C[0]~C[3] to the minimum code and the maximum code, and the electronic circuit 100 may subtracts the maximum code and the minimum code to generate a peak-to-peak jitter amount code. For example, when the shrinking element 121_1 receives the pulse-train signal PT has a sequence of 3 pulses P1~P3. In this exemplary embodiment, the first pulse P1 is the smallest, therefore the first pulse P1 is surviving through only the shrinking element 121_1 during the time t0 to time t1, so that the catch bit C[0] is "1". During the time t1 to time t2, the electronic circuit 100 may determine that the minimum code is "0", the maximum code is "0", and the peak-to-peak jitter amount code is "0" (0−0=0). Then, the second pulse P2 is the largest, therefore the second pulse P2 is surviving through three shrinking elements 121_1~121_3 during the time t2 to time t3, so that the catch bit C[2] is "1". During the time t3 to time t4, the electronic circuit 100 may determine that the minimum code is still "0", the maximum code is "2", and the peak-to-peak jitter amount code is "2" (2−0=2). Finial, the third pulse P3 is surviving through two shrinking elements 121_1~121_2 during the time t4 to time t5, so that the catch bit C[2] maintains "1". During the time t3 to time t4, the electronic circuit 100 may determine that the minimum code is still "0", the maximum code is still "2", and the peak-to-peak jitter amount code is still "2" (2−0=0).

Accordingly, in this exemplary embodiment, each of the uni-stable signals Q[0]~Q[3] reacts with a one-shot signal each time when they respectively see the shrinking pulse X[0]~X[3]. Due to its self-refresh nature, each of the uni-stable signals Q[0]~Q[3] can react repeatedly. For the first pulse, the watermark is location "0", thus the catch bit C[0] goes high after seeing the first pulse P1. Similarly, the catch bit C[1] and the catch bit C[2] both become sticky "1" after the second pulse P2 and the third pulse P3 have travelled through the pulse-shrinking block 120. In this exemplary embodiment, the minimum code, maximum code, and the peak-to-peak jitter amount code have changed dynamically during this monitoring process, to reflect the latest situations.

In summary, the electronic circuit of the disclosure is capable of performing online monitor of a clock signal generated by the phase-locked loop, and the electronic circuit of the disclosure can determine the period jitter of the clock signal. In particular, the electronic circuit of the disclosure can determine the minimum clock period and the maximum clock period of the clock signal. Therefore, the electronic circuit of the disclosure or other processing circuit can effectively perform corresponding operations by the above detail information related to the period jitter of the clock signal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An electronic circuit for online monitoring a clock signal, comprising:
   a period-to-pulse converter, receiving the clock signal outputted by a phase-locked loop, and converting each of a plurality of clock period samples of the clock signal to generate a pulse-train signal having a plurality of pulses;
   a pulse-shrinking block, coupled to the period-to-pulse converter, receiving the plurality of pulses of the pulse-train signal, and generating a plurality of catch bits by shrinking the plurality of pulses of the pulse-train signal; and
   an encoder, coupled to the pulse-shrinking block, outputting a minimum code denoting a minimum clock period of the clock signal and a maximum code denoting a maximum clock period of the clock signal according to the plurality of catch bits,
   wherein the electronic circuit subtracts the maximum code and the minimum code to generate a peak-to-peak jitter amount code.

2. The electronic circuit of claim 1, wherein the pulse-shrinking block comprises a plurality of stages, and each of the plurality of stages comprises:
   a shrinking element, continuously receives the plurality of pulses of the pulse-train signal or receives a plurality of previous shrinking pulses from a previous stage, and continuously outputs a plurality of current shrinking pulses;
   a first layer circuit, coupled to the shrinking element, and outputs a plurality of current uni-stable signals with a plurality of current stable values according to the plurality of current shrinking pulses; and
   a second layer circuit, coupled to the first layer circuit, and receives the plurality of current uni-stable signals with the plurality of current stable values and a plurality of next uni-stable signals with a plurality of next stable values from another first layer circuit of next stage,
   wherein the second layer circuit sequentially compares the plurality of current stable values and the plurality of next stable values to determine one of the plurality of catch bits.

3. The electronic circuit of claim 2, wherein when the second layer circuit determines any one of the plurality of current stable values is different from corresponding any one of the plurality of next stable values, the second layer circuit set the one of the plurality of catch bits from "0" to "1".

4. The electronic circuit of claim 3, wherein the encoder outputs the minimum code according to a catch bit outputted by a minimum stage with the catch bit set to "1", and the encoder outputs the maximum code according to another catch bit outputted by a maximum stage with the another catch bit set to "1".

5. The electronic circuit of claim 2, wherein the shrinking element is composed of two inverters coupled in series.

6. The electronic circuit of claim 2, wherein the first layer circuit comprises a first flip-flop unit, wherein an input terminal of the first flip-flop unit receives a signal with a high logic level, a trigger terminal of the first flip-flop unit is coupled to the shrinking element, an output terminal of the first flip-flop unit is coupled to the second layer circuit, and the output terminal of the first flip-flop unit is coupled to an inverted reset terminal of the first flip-flop unit through one or more buffers and one inverter coupled in series.

7. The electronic circuit of claim 6, wherein the second layer circuit comprises a second flip-flop unit and an OR gate, wherein an input terminal of the second flip-flop unit is coupled to an output terminal of the OR gate, an inverted trigger terminal is coupled to the output terminal of the first flip-flop unit, and an output terminal of the second flip-flop unit is coupled to an input terminal of the OR gate, and an inverted input terminal of the OR gate is coupled to an output terminal of another first flip-flop unit of next stage.

8. The electronic circuit of claim 1, wherein the electronic circuit is an all-digital electronic circuit.

9. The electronic circuit of claim 1, wherein each pulse width of the plurality of pulses of the pulse-train signal is positively related to each clock period length of the plurality of clock period samples of the clock signal.

10. The electronic circuit of claim 1, wherein the period-to-pulse converter uninterruptedly receives a plurality of clock signals to output a plurality of pulse-train signals to the pulse-shrinking block, and the pulse-shrinking block generates a plurality catch bit sequences, wherein the encoder outputs a plurality of minimum codes and a plurality of maximum codes corresponding to the plurality catch bit sequences during a plurality of monitoring periods, so that the electronic circuit real-time determines a plurality of peak-to-peak jitter amount codes corresponding to the plurality of clock signals.

* * * * *